United States Patent
Li et al.

(10) Patent No.: US 11,229,132 B2
(45) Date of Patent: Jan. 18, 2022

(54) DUAL DISPLAY DEVICE

(71) Applicant: Wuhan China Star Optoelectronics Semiconductor Display Technology Co., Ltd., Wuhan (CN)

(72) Inventors: Yun Li, Wuhan (CN); Xuesi Qin, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 188 days.

(21) Appl. No.: 16/621,247

(22) PCT Filed: Jun. 28, 2019

(86) PCT No.: PCT/CN2019/093672
§ 371 (c)(1),
(2) Date: Dec. 11, 2019

(87) PCT Pub. No.: WO2020/155546
PCT Pub. Date: Aug. 6, 2020

(65) Prior Publication Data
US 2021/0282281 A1 Sep. 9, 2021

(30) Foreign Application Priority Data
Jan. 30, 2019 (CN) .......................... 201910093579.3

(51) Int. Cl.
*H05K 5/02* (2006.01)
*H05K 5/00* (2006.01)

(52) U.S. Cl.
CPC ......... *H05K 5/0217* (2013.01); *H05K 5/0017* (2013.01)

(58) Field of Classification Search
CPC ............................... H05K 5/0017; G06F 1/00
See application file for complete search history.

(56) References Cited

U.S. PATENT DOCUMENTS

| | | | | |
|---|---|---|---|---|
| 7,310,050 | B2* | 12/2007 | Yeh | G06F 1/1624 340/815.4 |
| 10,602,623 | B1* | 3/2020 | Myers | H05K 1/181 |
| 2009/0051830 | A1* | 2/2009 | Matsushita | G06F 1/1647 348/836 |
| 2009/0231307 | A1* | 9/2009 | Lee | G06F 1/1652 345/184 |

(Continued)

FOREIGN PATENT DOCUMENTS

| | | |
|---|---|---|
| CN | 1553252 | 12/2004 |
| CN | 107615208 | 1/2018 |

(Continued)

*Primary Examiner* — Stephen S Sul
*Assistant Examiner* — Alexander Ryan Horton (57) ABSTRACT

A dual display device is provided, which includes a housing, a first display screen, a flexible display screen, and a rotating assembly. The housing includes a plurality of vertical walls and a bottom wall, the plurality of vertical walls include a second vertical wall. The first display screen is mounted in the housing at a first predetermined distance from the bottom wall, and a first edge of the first display screen is spaced apart from the second vertical wall by a second predetermined distance. The rotating assembly is rotatably disposed in an opening in an axial direction of the rotating assembly.

18 Claims, 7 Drawing Sheets

(56) References Cited

U.S. PATENT DOCUMENTS

| | | | |
|---|---|---|---|
| 2009/0290298 A1* | 11/2009 | Hsieh | G06F 1/1639 |
| | | | 361/679.27 |
| 2010/0124006 A1* | 5/2010 | Chang | G06F 1/1647 |
| | | | 361/679.04 |
| 2011/0249202 A1* | 10/2011 | Park | H04N 5/64 |
| | | | 348/790 |
| 2015/0153777 A1* | 6/2015 | Liu | G06F 1/1652 |
| | | | 345/173 |
| 2015/0220299 A1* | 8/2015 | Kim | G06F 3/013 |
| | | | 345/1.3 |
| 2016/0170450 A1 | 6/2016 | Kim et al. | |
| 2016/0259366 A1* | 9/2016 | Kenney | H04N 5/64 |
| 2016/0355322 A1* | 12/2016 | Burton, Jr. | A61J 7/0481 |
| 2017/0123459 A1* | 5/2017 | Song | G06F 1/163 |
| 2017/0212556 A1* | 7/2017 | Jovanovic | G06F 1/1652 |
| 2018/0129246 A1 | 5/2018 | Ko | |
| 2019/0297736 A1 | 9/2019 | Xu et al. | |
| 2020/0221585 A1* | 7/2020 | Cho | H05K 5/0017 |

FOREIGN PATENT DOCUMENTS

| | | |
|---|---|---|
| CN | 107993573 | 5/2018 |
| CN | 108230937 | 6/2018 |
| CN | 108877532 | 11/2018 |
| CN | 109448556 | 3/2019 |

* cited by examiner

DUAL DISPLAY DEVICE

FIELD OF INVENTION

The present application relates to a field of display technologies, and in particular, to a dual display device.

BACKGROUND OF INVENTION

At present, electronic products tend to come in diverse forms, and a dual display function has become an important feature of electronic products in the new era.

Technical Problem

It is an object of embodiments of the present application to provide a dual display device having beneficial effects of improving display diversity.

SUMMARY OF INVENTION

Technical Solution

The embodiment of the present application provides a dual display device, including a housing, a first display screen, a flexible display screen, and a rotating assembly; the housing including a bottom wall and a plurality of vertical walls disposed on the bottom wall, wherein the plurality of vertical walls include a second vertical wall, and the first display screen is mounted in the housing at a first predetermined distance from the bottom wall to form a containing chamber between a bottom surface of the first display screen and the bottom wall, and a first edge of the first display screen is spaced apart from the second vertical wall by a second predetermined distance to form an opening between the first edge and the second vertical wall and connect with the containing chamber, and the rotating assembly is rotatably disposed in the opening in an axial direction of the rotating assembly; the flexible display screen including a first end, a second end, and a curved section between the first end and the second end, the first end extending from a gap between the rotating assembly and the second vertical wall into the containing chamber, wherein the second end of the flexible display screen is disposed on the first display screen, the rotating assembly abuts an inner side of the curved section, and the rotating assembly is configured to rotate and to drive the first end and the second end sliding in parallel to the first display screen and in a reverse direction; wherein the second end includes a first limiting mechanism for preventing the flexible display screen from sliding completely into the containing chamber, and the first end includes a second limit mechanism for preventing the flexible display screen from sliding completely out of the containing chamber.

In a dual display device of the present application, the plurality of vertical walls include two oppositely disposed first vertical walls, and both ends of the rotating assembly are rotatably coupled to the first vertical walls.

In a dual display device of the present application, the rotating assembly includes a cylindrical body and two latches disposed at both ends of the cylindrical body, two first vertical walls are provided with two insertion holes facing each other, and the two latches are rotatably inserted into the two insertion holes.

In a dual display device of the present application, a back surface of the flexible display screen is provided with a first anti-skid pattern, and a second anti-skid pattern adapted to the first anti-skid pattern is disposed on a surface of the cylindrical body.

In a dual display device of the present application, an inner side of the first vertical wall is provided with a U-shaped slide rail, and the U-shaped slide rail includes a first horizontal section and a second horizontal section parallel to each other and a curved section for connecting the first horizontal section and the second horizontal section, wherein the first horizontal section is disposed outside the first display screen, the second horizontal section is disposed inside the first display screen, the curved section is disposed at the opening, and a side of the flexible display screen is slidably connected to the U-shaped slide rail.

In a dual display device of the present application, the U-shaped slide rail is a U-shaped chute.

In a dual display device of the present application, the housing further includes a horizontal limiting plate parallel to the bottom wall, the horizontal limiting plate is opposite to the opening, three sides of the horizontal limiting plate are connected to the second vertical wall and the two first vertical walls, and a foam filling layer is disposed between the horizontal limiting plate, the second vertical wall, and the two first vertical walls.

In a dual display device of the present application, further including an operating functional module, wherein the operating functional module is disposed on the horizontal limiting plate.

In a dual display device of the present application, further including an operating functional module disposed at an end of the first display screen from the opening.

In a dual display device of the present application, the plurality of vertical walls further include a third vertical wall disposed opposite the second vertical wall, and the third vertical wall is further provided with an elastic structure configured to buffer the second end, and the elastic structure is disposed in the containing chamber.

The embodiment of the present application further provides a dual display device including a housing, a first display screen, a flexible display screen, and a rotating assembly; the housing including a bottom wall and a plurality of vertical walls disposed on the bottom wall, wherein the plurality of vertical walls include a second vertical wall, and the first display screen is mounted in the housing at a first predetermined distance from the bottom wall to form a containing chamber between a bottom surface of the first display screen and the bottom wall, and a first edge of the first display screen is spaced apart from the second vertical wall by a second predetermined distance to form an opening between the first edge and the second vertical wall and connect with the containing chamber, and the rotating assembly is rotatably disposed in the opening in an axial direction of the rotating assembly; the flexible display screen including a first end, a second end, and a curved section between the first end and the second end, the first end extending from a gap between the rotating assembly and the second vertical wall into the containing chamber, wherein the second end of the flexible display screen is disposed on the first display screen, the rotating assembly abuts an inner side of the curved section, and the rotating assembly is configured to rotate and to drive the first end and the second end sliding in parallel to the first display screen and in a reverse direction.

In a dual display device of the present application, the plurality of vertical walls include two oppositely disposed first vertical walls, and both ends of the rotating assembly are rotatably coupled to the first vertical walls.

In a dual display device of the present application, the rotating assembly includes a cylindrical body and two latches disposed at both ends of the cylindrical body, two first vertical walls are provided with two insertion holes facing each other, and the two latches are rotatably inserted into the two insertion holes.

In a dual display device of the present application, a back surface of the flexible display screen is provided with a first anti-skid pattern, and a second anti-skid pattern adapted to the first anti-skid pattern is disposed on a surface of the cylindrical body.

In a dual display device of the present application, an inner side of the first vertical wall is provided with a U-shaped slide rail, and the U-shaped slide rail includes a first horizontal section and a second horizontal section parallel to each other and a curved section for connecting the first horizontal section and the second horizontal section, wherein the first horizontal section is disposed outside the first display screen, the second horizontal section is disposed inside the first display screen, the curved section is disposed at the opening, and a side of the flexible display screen is slidably connected to the U-shaped slide rail.

In a dual display device of the present application, the U-shaped slide rail is a U-shaped chute.

In a dual display device of the present application, the housing further includes a horizontal limiting plate parallel to the bottom wall, the horizontal limiting plate is opposite to the opening, three sides of the horizontal limiting plate are connected to the second vertical wall and the two first vertical walls, and a foam filling layer is disposed between the horizontal limiting plate, the second vertical wall, and the two first vertical walls.

In a dual display device of the present application, further including an operating functional module, wherein the operating functional module is disposed on the horizontal limiting plate.

In a dual display device of the present application, further including an operating functional module disposed at an end of the first display screen from the opening.

In a dual display device of the present application, the plurality of vertical walls further include a third vertical wall disposed opposite the second vertical wall, and the third vertical wall is further provided with an elastic structure configured to buffer the second end, and the elastic structure is disposed in the containing chamber.

Beneficial Effect

The dual display device of embodiments of the present application is equipped with a first display screen, a flexible display screen, and a rotating assembly, so that the flexible display screen can be collected into a housing or released to outside the housing, which has the beneficial effect of improving display diversity.

BRIEF DESCRIPTION OF FIGURES

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art can obtain the other drawings without any creative effort.

DETAILED DESCRIPTION OF EMBODIMENTS

The embodiments of the present application are described in detail below, and the examples of the embodiments are illustrated in the drawings, wherein the same or similar reference numerals are used to refer to the same or similar elements or elements having the same or similar functions. The embodiments described below with reference to the accompanying drawings are intended to be illustrative, and are not to be construed as limitation.

In the description of the present application, it is to be understood that directional terms mentioned in the present invention, such as "center", "longitudinal", "transverse", "length", "width", "thickness", "up", "down", "front", "back", "left", "right", "vertical", "horizontal", "top", "bottom", "inside", "outside", "clockwise", "counterclockwise", etc., are only used with reference to the orientation of the accompanying drawings, and is merely for the convenience of describing the present application and the simplified description, and does not indicate or imply that the device or component referred to has a specific orientation, and is constructed and operated in a specific orientation. Therefore, it should not be construed as limiting the application. Moreover, the terms "first" and "second" are used for descriptive purposes only and are not to be construed as indicating or implying a relative importance or implicitly indicating the number of technical features indicated. Thus, features defining "first" or "second" can include one or more of the described features either explicitly or implicitly. In the description of the present application, the meaning of "a plurality" is two or more unless specifically and specifically defined otherwise.

In the description of the present application, it should be noted that the terms "installation", "connected", and "connected" are to be understood broadly, unless otherwise specifically defined. For example, it can be a fixed connection, a detachable connection, or an integral connection, it can be a mechanical connection, an electrical connection or communicate with each other; it can be directly connected, or can be indirectly connected through an intermediate medium, and can be the communication of the two internal components or the interaction of the two components. For those skilled in the art, the specific meanings of the above terms in the present application can be understood on a case-by-case basis.

In the present application, unless explicitly stated and defined otherwise, the first feature "on" or "under" the second feature can include direct contact of the first and second features, and can also be included that the first and second features are not in direct contact but are contacted by additional features between them. Moreover, the first feature "up", "above" and "on" the second feature includes the first feature directly right above and obliquely upward the second feature, or merely indicating that a level height of the first feature is higher than a level height of the second feature. The first feature "below", "under" and "lower" the second feature includes the first feature right below and obliquely below the second feature, or merely a level height of the first feature is less than a level height of the second feature.

The following disclosure provides many different embodiments or examples for implementing different structures of the present application. In order to simplify the disclosure of the present application, the components and settings of the specific examples are described below. Of course, they are merely examples and are not intended to limit the application. In addition, the present application can repeat reference numerals and/or reference numerals in different examples, which are for the purpose of simplicity and clarity, and do not indicate the relationship between the various embodiments and/or arrangements discussed. Furthermore, the present application provides examples of different processes and materials, but one of ordinary skill in the art can be appreciated that other processes and applications and/or other materials.

Figure 1:
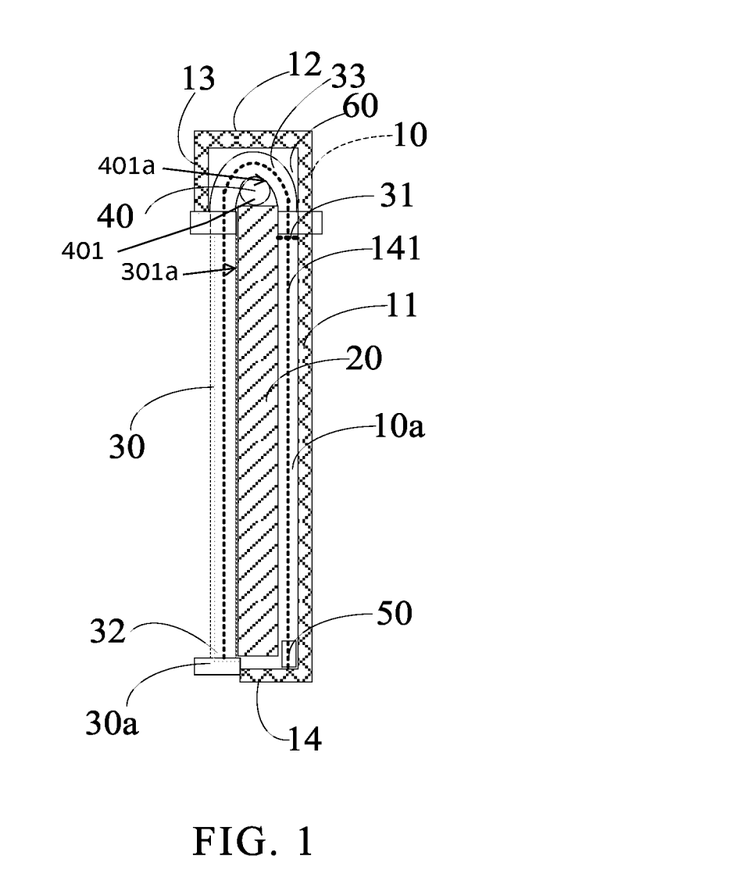
FIG. 1 is a first schematic view of a structural diagram of a dual display device provided by an embodiment of the present application.
Figure 2:
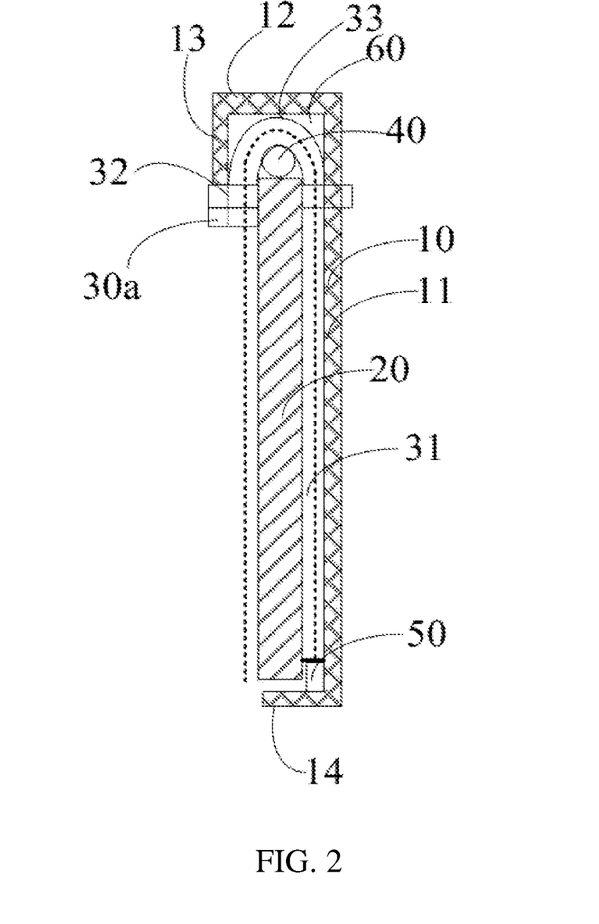
FIG. 2 is a second schematic view of a structural diagram of the dual display device according to the embodiment of the present application.

Please refer to FIG. 1 and FIG. 2, where FIG. 1 is a first schematic view of a structural diagram of a dual display device according to an embodiment of the present application. FIG. 2 is a second schematic view of a structural diagram of a dual display device according to an embodiment of the present application. The dual display device including a housing 10, a first display screen 20, a flexible display screen 30, and a rotating assembly 40.

The housing 10 includes a bottom wall 11 and a plurality of vertical walls disposed on the bottom wall 11. The plurality of vertical walls include a second vertical wall 12, and the first display screen 20 is mounted in the housing 10 at a first predetermined distance from the bottom wall 11 to form a containing chamber 10a between a bottom surface of the first display screen and the bottom wall 11, and a first edge of the first display screen 20 is spaced apart from the second vertical wall 12 by a second predetermined distance to form an opening between the first edge and the second vertical wall 12 and connect with the containing chamber 10a, and the rotating assembly 40 is rotatably disposed in the opening in an axial direction of the rotating assembly 40.

The flexible display screen 30 includes a first end 32, a second end 31, and a curved section 33 between the first end 32 and the second end 31, the first end 32 extends from a gap between the rotating assembly 40 and the second vertical wall 12 into the containing chamber 10a. The second end of the flexible display screen 30 is disposed on the first display screen 20, the rotating assembly 40 abuts an inner side of the curved section, and the rotating assembly 40 is configured to rotate and to drive the first end 32 and the second end 31 sliding in parallel to the first display screen 20 and in a reverse direction.

FIG. 1 is a scene of a majority of the flexible display screen 30 positioned on the first display screen 20, where the dual display device uses the flexible display screen 30 for display. FIG. 2 shows that after rotating the rotating assembly 40, most of the flexible display screen 30 enters the containing chamber 10a, and the dual display device uses the first display screen for display.

Figure 6:
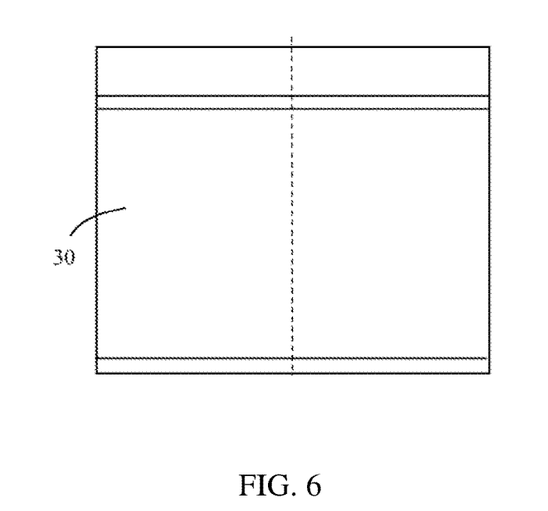
FIG. 6 is a schematic view of unfolded state of the dual display device shown in FIG. 1.
Figure 7:
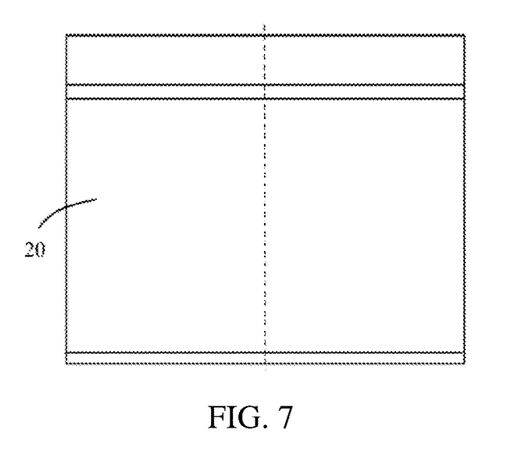
FIG. 7 is a schematic view of unfolded state of the dual display device shown in FIG. 2.

Further, please refer to FIG. 6 and FIG. 7, where FIG. 6 is a schematic view of unfolded state of the dual display device shown in FIG. 1, FIG. 7 is a schematic view of unfolded state of the dual display device shown in FIG. 2. As shown in FIG. 6, the dual display device uses the flexible display screen 30 for display. As shown in FIG. 7, most of the flexible display screen 30 enters the containing chamber 10a, the dual display device uses the first display screen 20 for display.

Figure 3:
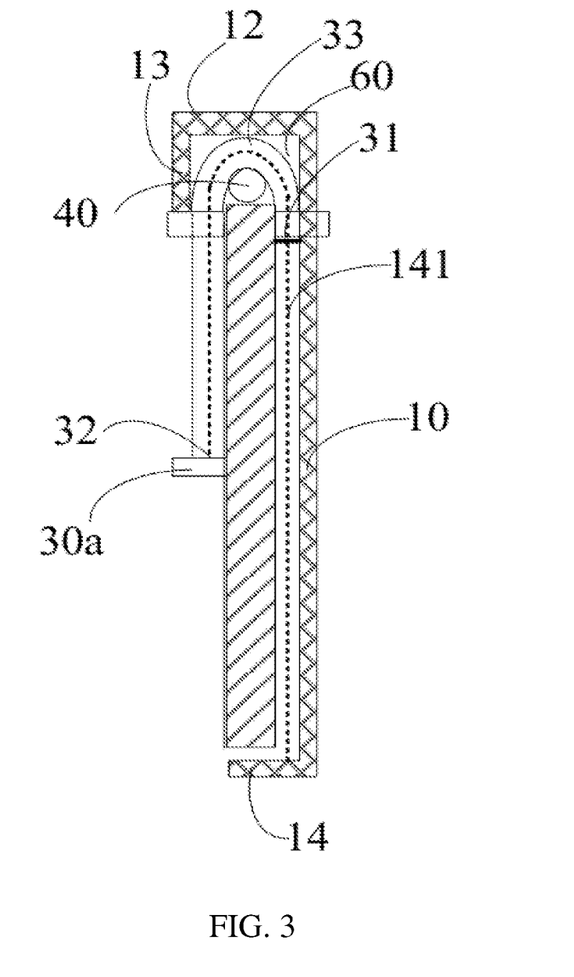
FIG. 3 is a third schematic view of a structural diagram of the dual display device according to the embodiment of the present application.

It can be understood that a length of the flexible display screen 30 can be greater than a length of the first display screen (as shown in FIG. 1 and FIG. 2). Referring to FIG. 3, where FIG. 3 is a third schematic diagram of a structure diagram of a dual display device according to an embodiment of the present application. As shown in FIG. 3, in some embodiments, the length of the flexible display screen 30 can also be less than the length of the first display screen, such that the second end of the flexible display screen is positioned in the middle of the first display screen, and the first display screen 20 and the flexible display screen 30 can be used for cooperative display.

Figure 8:
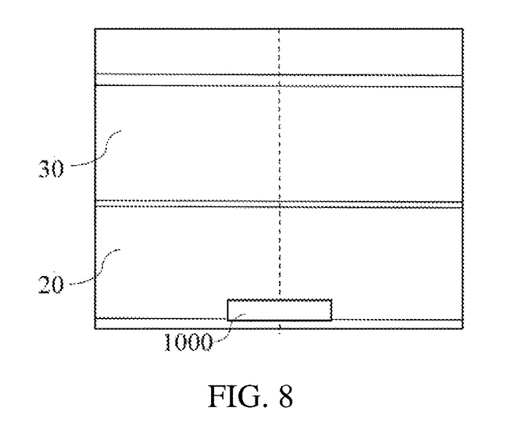
FIG. 8 is a schematic view of unfolded state of the dual display device shown in FIG. 3.

Further, please refer to FIG. 8, where FIG. 8 is a schematic view of unfolded state of the dual display device shown in FIG. 3. As shown in FIG. 8, the dual display device uses the flexible display screen 30 and the first display screen 20 for display. Specifically, the flexible display screen 30 can be used for high-definition video display and the first display screen 20 can be used for text display, and the first display screen 20 can implement functions such as chat software, mail exchange, and keyboard input at the same time. In addition, a front camera 1000 can be completely inside the first display screen 20, so that a screen ratio of the flexible display screen 30 is greatly improved.

Figure 9:
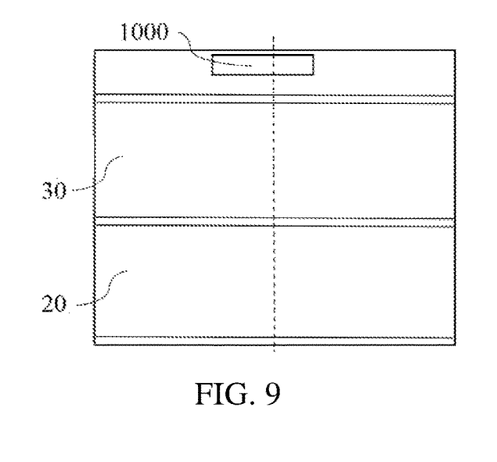
FIG. 9 is another schematic view of unfolded state of the dual display device shown in FIG. 3.

Please refer to FIG. 9, FIG. 9 is another schematic view of unfolded state of the dual display device shown in FIG. 3. As shown in FIG. 9, the dual display device uses the flexible display screen 30 and the first display screen 20 for display. Specifically, the flexible display screen 30 can be used for high-definition video display and the first display screen 20 can be used for text display, and the first display screen 20 can implement functions such as chat software, mail exchange, and keyboard input at the same time. In addition, a front camera 1000 is placed on a side of the flexible display screen 30 to increase its placement space and increase a screen ratio of the first display screen 20.

The flexible display screen 30 is a high resolution active-matrix organic light-emitting diode (AMOLED). The first display is a hard display and can be either a liquid crystal display (LCD) display or an organic light-emitting diode (OLED) display.

Figure 10:
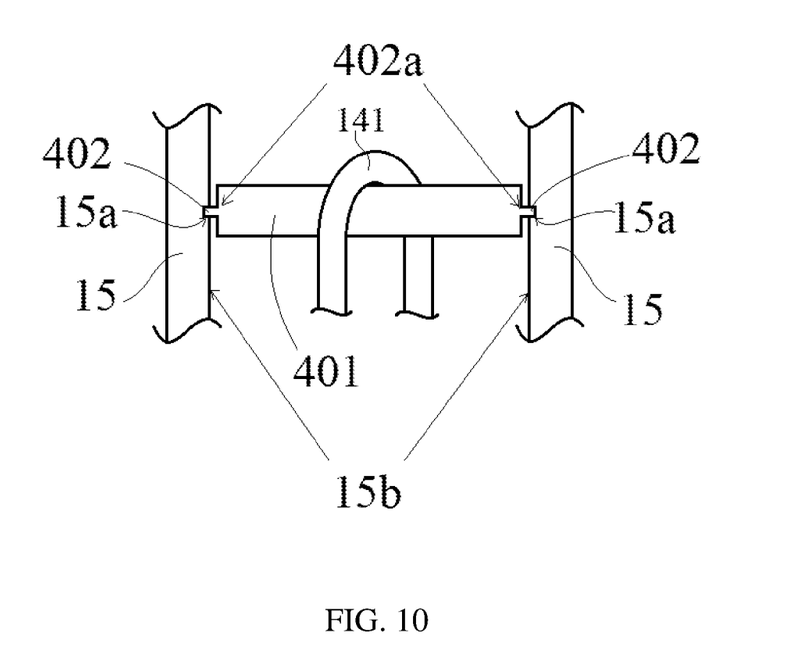
FIG. 10 is a schematic view of unfolded state of a part of the dual display device according to the embodiment of the present application.

Referring to FIG. 10, FIG. 10 is a schematic view of unfolded state of a part of the dual display device according to the embodiment of the present application. Specifically, the plurality of vertical walls include two opposite first vertical walls 15), and both ends 402a of the rotating assembly 40 are respectively rotatably connected to the first vertical wall 15. The rotating assembly 40 includes a cylindrical body 401 and two latches 402 disposed at both ends 402a of the cylindrical body 401, two first vertical walls 15 are provided with two insertion holes 15*a* facing each other, and the two latches 401 are rotatably inserted into the two insertion holes 15*a*.

Referring to FIG. 1, a back surface of the flexible display screen 30 is provided with a first anti-skid pattern 301*a*, and a second anti-skid pattern 401*a* adapted to the first anti-skid pattern 301*a* is disposed on a surface of the cylindrical body 401, so that slippage between the flexible display screen 30 and the rotating assembly 40 can be avoided.

Referring to FIG. 10, an inner side 15*b* of the first vertical wall 15 is provided with a U-shaped slide rail 141, and the U-shaped slide rail 141 includes a first horizontal section and a second horizontal section parallel to each other and a curved section for connecting the first horizontal section and the second horizontal section. The first horizontal section is disposed outside the first display screen 20, the second horizontal section is disposed inside the first display screen 20, the curved section is disposed at the opening, and a side of the flexible display screen 30 is slidably connected to the U-shaped slide rail. The U-shaped slide rail 141 can be a U-shaped chute.

The housing 10 further includes a horizontal limiting plate 13 parallel to the bottom wall 11, the horizontal limiting plate 13 is opposite to the opening, and three sides of the horizontal limiting plate 13 are connected to the second vertical wall 12 and the two first vertical walls 15, and a foam filling layer 60 is disposed between the horizontal limiting plate, the second vertical wall, and the two first vertical walls 15.

Figure 4:
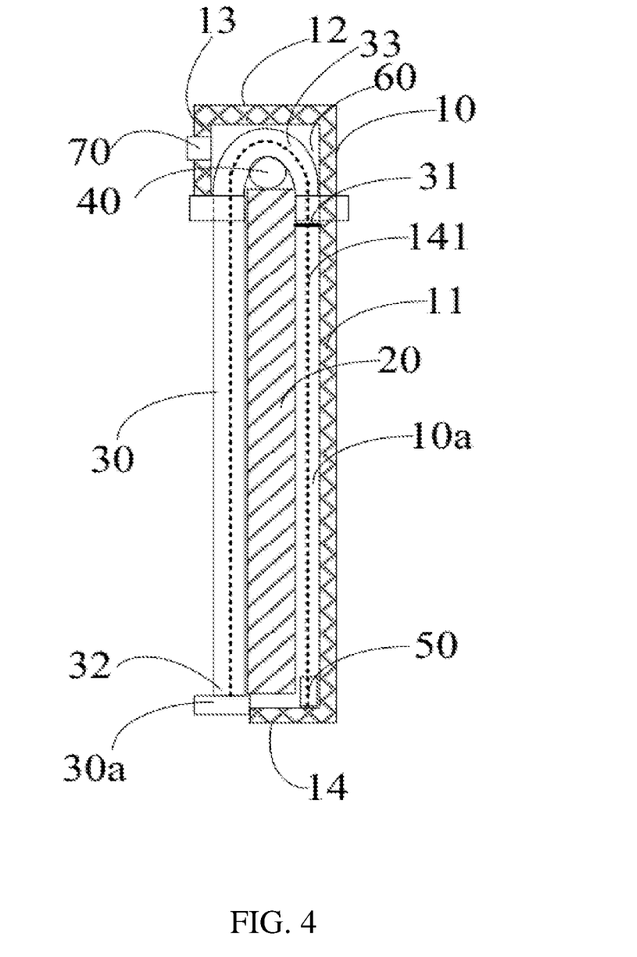
FIG. 4 is a fourth schematic view of a structural diagram of the dual display device according to the embodiment of the present application.
Figure 5:
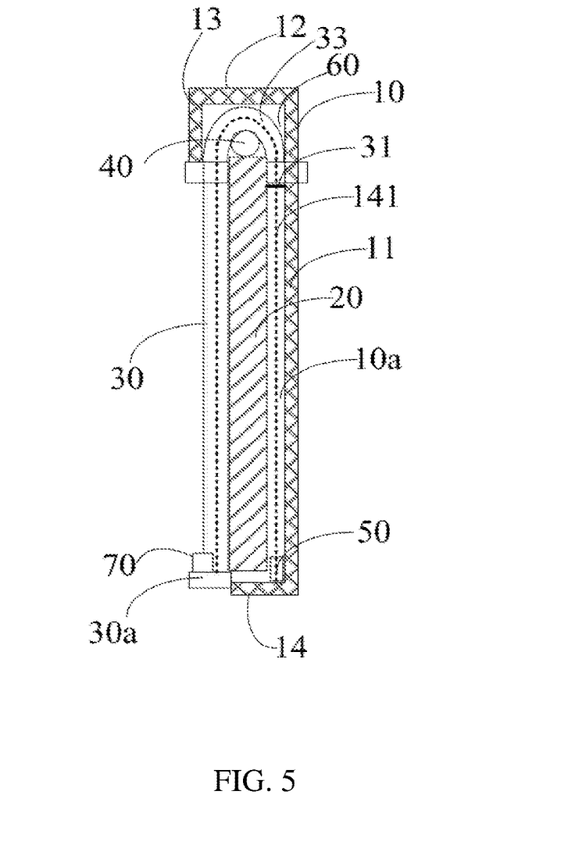
FIG. 5 is a fifth schematic view of a structural diagram of the dual display device according to the embodiment of the present application.

Please refer to FIG. 4 and FIG. 5, FIG. 4 is a fourth schematic diagram of a structure diagram of a dual display device according to an embodiment of the present application. FIG. 5 is a fifth schematic view of a structure diagram of a dual display device according to an embodiment of the present application. In some embodiments, the dual display device further includes an operating functional module 70.

The operating functional module 70 can be disposed on the horizontal limiting plate 13 (as shown in FIG. 4). Of course, the operating functional module 70 can also be disposed at an end of the first display screen 20 from the opening (as shown in FIG. 5).

The operating functional module 70 can be a fingerprint identification module, a camera, a receiver, and the like.

In some embodiments, the second end the flexible display screen 30 includes a first limiting mechanism 30*a* for preventing the flexible display screen 30 from sliding completely into the containing chamber. The first limiting mechanism 30*a* is a baffle.

In some embodiments, the first end of the flexible display screen 30 includes a second limit mechanism for preventing the flexible display screen 30 from sliding completely out of the containing chamber. The second limiting mechanism can be a baffle.

In some embodiments, the plurality of vertical walls further include a third vertical wall 14 disposed opposite the second vertical wall 12, and the third vertical wall 14 is further provided with an elastic structure 50 configured to buffer the second end 31, and the elastic structure 50 is disposed in the containing chamber 10*a*.

Embodiments of the present invention have been described, but not intending to impose any unduly constraint to the appended claims. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A dual display device, comprising: a housing, a first display screen, a flexible display screen, and a rotating assembly;

the housing comprising a bottom wall and a plurality of vertical walls disposed on the bottom wall, wherein the plurality of vertical walls comprise a second vertical wall and a third vertical wall disposed opposite the second vertical wall, the third vertical wall is provided with an elastic structure configured to buffer a second end, the elastic structure is disposed in a containing chamber, the first display screen is mounted in the housing at a first predetermined distance from the bottom wall to form the containing chamber between a bottom surface of the first display screen and the bottom wall, a first edge of the first display screen is spaced apart from the second vertical wall by a second predetermined distance to form an opening between the first edge and the second vertical wall and connect with the containing chamber, and the rotating assembly is rotatably disposed in the opening in an axial direction of the rotating assembly;

the flexible display screen comprising a first end, the second end, and a curved section between the first end and the second end, the first end extending from a gap between the rotating assembly and the second vertical wall into the containing chamber, wherein the second end of the flexible display screen is disposed on the first display screen, the rotating assembly abuts an inner side of the curved section, and the rotating assembly is configured to rotate and to drive the first end and the second end sliding in parallel to the first display screen and in a reverse direction; and wherein the second end comprises a first limiting mechanism for preventing the flexible display screen from sliding completely into the containing chamber, and the first end comprises a second limit mechanism for preventing the flexible display screen from sliding completely out of the containing chamber.

2. The dual display device according to claim 1, wherein the plurality of vertical walls comprise two oppositely disposed first vertical walls, and both ends of the rotating assembly are rotatably coupled to the two oppositely disposed first vertical walls.

3. The dual display device according to claim 2, wherein the rotating assembly comprises a cylindrical body and two latches disposed at the both ends of the rotating assembly, the two oppositely disposed first vertical walls are provided with two insertion holes facing each other, and the two latches are rotatably inserted into the two insertion holes.

4. The dual display device according to claim 3, wherein a back surface of the flexible display screen is provided with a first anti-skid pattern, and a second anti-skid pattern adapted to the first anti-skid pattern is disposed on a surface of the cylindrical body.

5. The dual display device according to claim 2, wherein an inner side of each of the two oppositely disposed first vertical walls is provided with a U-shaped slide rail, and the U-shaped slide rail comprises a first horizontal section and a second horizontal section parallel to each other and a curved section for connecting the first horizontal section and the second horizontal section, wherein the first horizontal section is disposed outside the first display screen, the second horizontal section is disposed inside the first display screen, the curved section is disposed at the opening, and a side of the flexible display screen is slidably connected to the U-shaped slide rail.

6. The dual display device according to claim 5, wherein the U-shaped slide rail is a U-shaped chute.

7. The dual display device according to claim 2, wherein the housing further comprises a horizontal limiting plate parallel to the bottom wall, the horizontal limiting plate is opposite to the opening, three sides of the horizontal limiting plate are connected to the second vertical wall and the two oppositely disposed first vertical walls, and a foam filling layer is disposed between the horizontal limiting plate, the second vertical wall, and the two oppositely disposed first vertical walls.

8. The dual display device according to claim 7, further comprising an operating functional module, wherein the operating functional module is disposed on the horizontal limiting plate.

9. The dual display device according to claim 1, further comprising an operating functional module disposed at an end of the first display screen adjacent to the opening.

10. A dual display device comprising: a housing, a first display screen, a flexible display screen, and a rotating assembly;
the housing comprising a bottom wall and a plurality of vertical walls disposed on the bottom wall, wherein the plurality of vertical walls comprise a second vertical wall and a third vertical wall disposed opposite the second vertical wall, the third vertical wall is provided with an elastic structure configured to buffer a second end, the elastic structure is disposed in a containing chamber, the first display screen is mounted in the housing at a first predetermined distance from the bottom wall to form the containing chamber between a bottom surface of the first display screen and the bottom wall, a first edge of the first display screen is spaced apart from the second vertical wall by a second predetermined distance to form an opening between the first edge and the second vertical wall and connect with the containing chamber, and the rotating assembly is rotatably disposed in the opening in an axial direction of the rotating assembly;
the flexible display screen comprising a first end, the second end, and a curved section between the first end and the second end, the first end extending from a gap between the rotating assembly and the second vertical wall into the containing chamber, wherein the second end of the flexible display screen is disposed on the first display screen, the rotating assembly abuts an inner side of the curved section, and the rotating assembly is configured to rotate and to drive the first end and the second end sliding in parallel to the first display screen and in a reverse direction.

11. The dual display device according to claim 10, wherein the plurality of vertical walls comprise two oppositely disposed first vertical walls, and both ends of the rotating assembly are rotatably coupled to the two oppositely disposed first vertical walls.

12. The dual display device according to claim 11, wherein the rotating assembly comprises a cylindrical body and two latches disposed at the both ends of the rotating assembly, the two oppositely disposed first vertical walls are provided with two insertion holes facing each other, and the two latches are rotatably inserted into the two insertion holes.

13. The dual display device according to claim 12, wherein a back surface of the flexible display screen is provided with a first anti-skid pattern, and a second anti-skid pattern adapted to the first anti-skid pattern is disposed on a surface of the cylindrical body.

14. The dual display device according to claim 11, wherein an inner side of each of the two oppositely disposed first vertical walls is provided with a U-shaped slide rail, and the U-shaped slide rail comprises a first horizontal section and a second horizontal section parallel to each other and a curved section for connecting the first horizontal section and the second horizontal section, wherein the first horizontal section is disposed outside the first display screen, the second horizontal section is disposed inside the first display screen, the curved section is disposed at the opening, and a side of the flexible display screen is slidably connected to the U-shaped slide rail.

15. The dual display device according to claim 14, wherein the U-shaped slide rail is a U-shaped chute.

16. The dual display device according to claim 11, wherein the housing further comprises a horizontal limiting plate parallel to the bottom wall, the horizontal limiting plate is opposite to the opening, three sides of the horizontal limiting plate are connected to the second vertical wall and the two oppositely disposed first vertical walls, and a foam filling layer is disposed between the horizontal limiting plate, the second vertical wall, and the two oppositely disposed first vertical walls.

17. The dual display device according to claim 16, further comprising an operating functional module, wherein the operating functional module is disposed on the horizontal limiting plate.

18. The dual display device according to claim 10, further comprising an operating functional module disposed at an end of the first display screen adjacent to the opening.

* * * * *